(12) United States Patent
Spesser et al.

(10) Patent No.: US 11,664,777 B2
(45) Date of Patent: May 30, 2023

(54) DC FILTER DEVICE

(71) Applicant: Dr. Ing. h.c. F. Porsche Aktiengesellschaft, Stuttgart (DE)

(72) Inventors: Daniel Spesser, Illingen (DE); Tim Pfizenmaier, Leonberg (DE); Stefan Endres, Reichenschwand (DE)

(73) Assignee: DR. ING. H.C. F. PORSCHE AKTIENGESELLSCHAFT, Stuttgart (DE)

( * ) Notice: Subject to any disclaimer, the term of this patent is extended or adjusted under 35 U.S.C. 154(b) by 0 days.

(21) Appl. No.: 17/378,842

(22) Filed: Jul. 19, 2021

(65) Prior Publication Data

US 2022/0029596 A1    Jan. 27, 2022

(30) Foreign Application Priority Data

Jul. 21, 2020    (DE) ...................... 10 2020 119 108.1

(51) Int. Cl.
*H03H 7/01* (2006.01)
*H02M 7/04* (2006.01)
(Continued)

(52) U.S. Cl.
CPC ........... *H03H 7/0138* (2013.01); *H01F 27/24* (2013.01); *H01F 27/28* (2013.01); *H01F 27/346* (2013.01); *H02M 1/44* (2013.01); *H02M 7/04* (2013.01)

(58) Field of Classification Search
CPC ...... H03H 7/0138; H03H 7/0115; H03H 7/38; H01F 27/24; H01F 27/28; H01F 27/346; H01F 17/062; H01F 2017/0093; H01F 27/2804; H01F 38/14; H01F 27/2823; H01F 27/32; H01F 27/38; H01F 27/29; H01F 37/00; H01F 2027/2809; H01F 27/40;
(Continued)

(56) References Cited

U.S. PATENT DOCUMENTS 6,288,915 B1    9/2001    Stemmler et al.
10,491,109 B2  11/2019    Amaducci
(Continued)

FOREIGN PATENT DOCUMENTS

DE    19757452 A1    6/1999
DE    10225409 A1    12/2003
(Continued)

*Primary Examiner* — Lincoln D Donovan
*Assistant Examiner* — Alex W Lam
(74) *Attorney, Agent, or Firm* — Leydig, Voit & Mayer, Ltd.

(57) ABSTRACT

A DC filter device includes: a first filter device connection; a second filter device connection; a third filter device connection; a fourth filter device connection; a coil core; at least one first coil arranged on the coil core, the at least one first coil being connected in between the first filter device connection and the third filter device connection; at least one second coil arranged on the coil core, the at least one second coil being connected in between the second filter device connection and the fourth filter device connection; and a third coil arranged on the coil core, the third coil having a first coil connection and a second coil connection. The first coil connection and the second coil connection are connected to one another via a circuit device, which circuit device has a resistor.

10 Claims, 5 Drawing Sheets

(51) Int. Cl.
  *H02M 1/44*   (2007.01)
  *H01F 27/28*   (2006.01)
  *H01F 27/34*   (2006.01)
  *H01F 27/24*   (2006.01)

(58) Field of Classification Search
  CPC ........ H02M 1/44; H02M 7/04; H02M 1/0064;
  H02M 1/143; H02M 1/32; H02M 1/126;
  H02M 1/12; H02M 1/123; H02M 7/003;
  H02M 1/14; H02M 1/007; H02J 3/01;
  H02J 3/36; H05K 1/165; G01R 31/52
  See application file for complete search history.

(56) References Cited

U.S. PATENT DOCUMENTS

| | | | |
|---|---|---|---|
| 11,088,614 | B2 | 8/2021 | Osako et al. |
| 2008/0080106 | A1* | 4/2008 | Mirafzal ................ H02M 1/12 |
| | | | 361/42 |
| 2010/0157552 | A1* | 6/2010 | Thom ..................... H03H 1/00 |
| | | | 336/200 |
| 2011/0254494 | A1 | 10/2011 | Briane et al. |
| 2012/0112528 | A1 | 5/2012 | Fassnacht |
| 2014/0225440 | A1 | 8/2014 | Oswald |
| 2015/0145446 | A1* | 5/2015 | Shitabo ................. H02P 27/06 |
| | | | 318/400.3 |
| 2015/0381136 | A1 | 12/2015 | Oswald |
| 2019/0165754 | A1* | 5/2019 | Zolomy .................. H04B 1/18 |

FOREIGN PATENT DOCUMENTS

| | | |
|---|---|---|
| DE | 102015110064 B4 | 12/2016 |
| DE | 102016220466 A1 | 4/2018 |
| DE | 102017105839 A1 | 9/2018 |
| EP | 3109987 A1 | 12/2016 |
| KR | 1020140102149 A | 8/2014 |
| KR | 1020150119106 A | 10/2015 |
| WO | WO 2017153366 A1 | 9/2017 |
| WO | WO 2018033377 A1 | 2/2018 |
| WO | WO 2018208057 A1 | 11/2018 |

* cited by examiner

DC FILTER DEVICE

CROSS-REFERENCE TO PRIOR APPLICATION

Priority is claimed to German Patent Application No. DE 10 2020 119 108.1, filed on Jul. 21, 2020, the entire disclosure of which is hereby incorporated by reference herein.

FIELD

The invention relates to a DC filter device and to an arrangement containing such a DC filter device.

BACKGROUND

DE 10 2016 220 466 A1 discloses a vehicle on-board power system having three on-board power system branches that have EMC filter circuits and different energy sources. A multiphase DC-to-DC converter connects different on-board power system branches.

US 2011/0254494 A1, US 2012/0112528 A1, WO 2017/153366 A1 and WO 2018/033377 A1 disclose vehicle on-board power systems having EMC filters.

SUMMARY

In an embodiment, the present invention provides a DC filter device, comprising: a first filter device connection; a second filter device connection; a third filter device connection; a fourth filter device connection; a coil core; at least one first coil arranged on the coil core, the at least one first coil being connected in between the first filter device connection and the third filter device connection; at least one second coil arranged on the coil core, the at least one second coil being connected in between the second filter device connection and the fourth filter device connection; and a third coil arranged on the coil core, the third coil having a first coil connection and a second coil connection, wherein the first coil connection and the second coil connection are connected to one another via a circuit device, which circuit device has a resistor.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
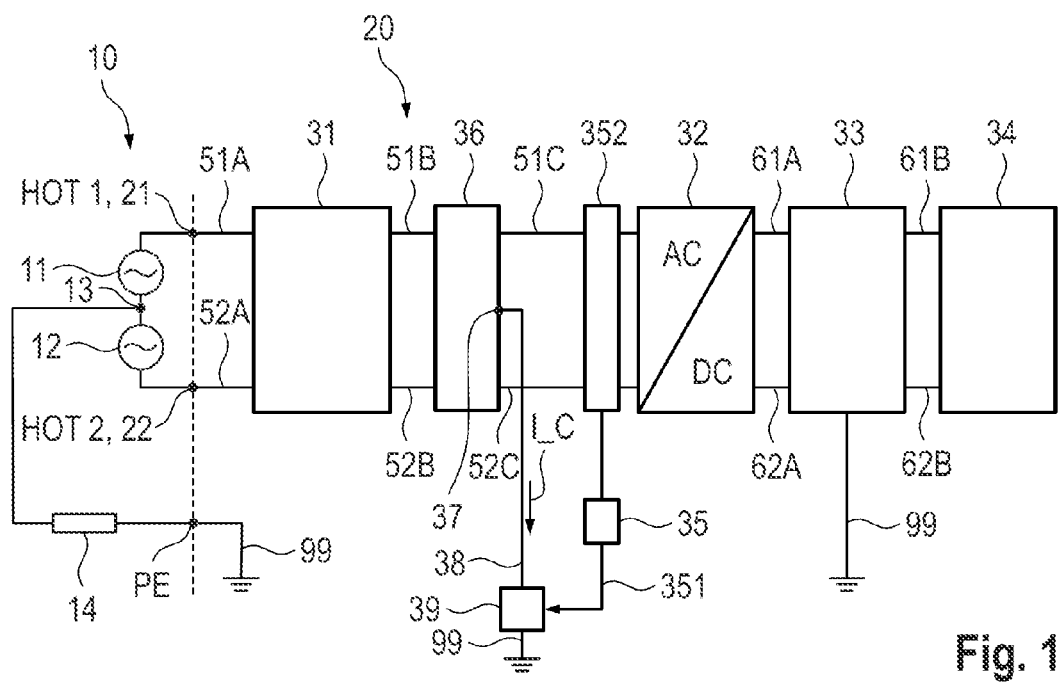
FIG. 1 shows a schematic illustration of an arrangement and a supply grid.

In an embodiment, the present invention provides a novel DC filter device and an arrangement containing such a DC filter device.

A DC filter device has a first filter device connection, a second filter device connection, a third filter device connection, a fourth filter device connection and a coil core, in which DC filter device at least one first coil is arranged on the coil core and is connected in between the first connection and the third connection, in which DC filter device at least one second coil is arranged on the coil core and is connected in between the second connection and the fourth connection, in which DC filter device a third coil is arranged on the coil core, which third coil has a first coil connection and a second coil connection, and which first coil connection and second coil connection are connected to one another via a circuit device, which circuit device has a resistor. The transfer function of the DC filter device is influenced via the third coil with the circuit device. Influencing the transfer function in this way makes it possible for example to reduce or avoid oscillations when feeding a compensation current into an overall arrangement.

According to one preferred embodiment, the resistor is designed as an SMD component. The design as an SMD component allows a space-saving structure and is unusual in combination with the third coil.

According to one preferred embodiment, the circuit device has a fourth coil that is connected in series with the resistor. The fourth coil is advantageous in particular for a higher frequency range with regard to the transfer function of the DC filter device.

According to one preferred embodiment, the fourth coil is designed as an SMD component. Such SMD components have proven to be advantageous over larger coils, in particular at higher frequencies.

According to one preferred embodiment, the fourth coil has a coil core made of nanocrystalline material. Such coils have proven to be advantageous in high frequency ranges due to their comparatively relatively high inductance.

According to one preferred embodiment, the third filter device connection and the fourth filter device connection are each connected to a protective earth connection via an associated capacitor. The capacitors allow a good reduction of electromagnetic interference.

According to one preferred embodiment, at least two first coils are arranged on the coil core and connected in between the first connection and the third connection, and at least two second coils are arranged on the coil core and connected in between the second connection and the fourth connection. The double coils make it possible to achieve a good filter effect on the coil core.

The arrangement contains an AC filter device, an AC-to-DC converter and such a DC filter device, which AC filter device is provided on the AC side of the AC-to-DC converter and which DC filter device is arranged on the DC side of the AC-to-DC converter. Such an arrangement allows good electromagnetic compatibility.

According to one preferred embodiment, the arrangement contains a compensation device for compensating for leakage currents, which compensation device is designed to generate a compensation current between a protective earth connection and a predefined coupling-in point of the arrangement. The compensation device reduces the risk of tripping of a fault current circuit breaker.

According to one preferred embodiment, the predefined coupling-in point is provided between the AC filter device and the DC filter device. Coupling-in at this point facilitates compensation.

According to one preferred embodiment, the predefined coupling-in point is provided between the AC filter device and the AC-to-DC converter. Coupling-in in the AC portion may take place in this region, and the coupling-in point is protected against interfering influences from the supply grid.

According to one preferred embodiment, the compensation device has a current regulator for regulating the compensation current to a target value. The current regulator allows a precise infeed of the compensation current, and the AC filter device is particularly well-suited to reducing unwanted oscillations when using current regulators.

An on-board power system has such an arrangement. The arrangement is particularly well-suited to on-board power systems, and such an on-board power system exhibits reliable and low-interference behavior at charging columns, for example.

Identical or functionally identical parts are provided with the same reference signs below and are usually described only once. The description spans the figures such that these build on one another, in order to avoid unnecessary repetitions.

FIG. 1 shows an arrangement 20, which is for example part of an on-board power system of a vehicle. The arrangement 20 is connected to a supply grid 10. The supply grid 10 is for example in the form of a US split-phase grid and has a first AC voltage source 11, which is connected to a second AC voltage source 12 via a point 13. The AC voltage source 11 provides a connection HOT1, and the AC voltage source 12 provides a connection HOT2. The point 13 is connected to a protective earth connection PE via a resistor 14. The resistor 14 characterizes the resistance of the corresponding line at the point 13 and is usually of the order of magnitude of a few ohms.

The arrangement 20 has a first connection 21, a second connection 22 and a connection 25. The connection 21 is connected to an AC filter device 31 via a line 51A, and the connection 22 is connected to the AC filter device 31 via a line 52A. The connection 25 is connected to a protective earth connection 99 that is able to be used in the entire arrangement 20.

The AC filter device 31 is connected to a device 36 via a line 51B and a line 52B, and the device 36 is connected to the AC side of an AC-to-DC converter 32 via a line 51C and a line 52C. The AC-to-DC converter 32 is connected to a DC filter device 33 via a line 61A and a line 62A. The line 61A is for example the positive line, and the line 62A is the negative line. The DC filter arrangement 33 is connected to the protective earth connection 99 and connected to a device 34 via a line 61B and a line 62B, this device for example being an on-board power system, a traction battery or a consumer. The lines 61B and 62B may also be referred to as HV+ and HV−, HV standing for high voltage.

The device 36 provides a coupling-in point 37. The coupling-in point 37 is connected to a compensation device 39 via a line 38, and the compensation device 39 is connected to the protective earth connection 99.

By way of example, provision is made for a sum current measuring arrangement 352 that measures the current flowing through the lines 51C and 52C on the AC side of the AC-to-DC converter 32, which current sums to 0 in the absence of leakage currents and may be other than zero in the case of leakage currents. The sum current measuring arrangement 352 is designed, in the exemplary embodiment, as a coil around the active conductors 51C, 52C or, in the case of a multiphase current supply, around all of the active conductors. The sum current measuring arrangement 352 may however also comprise a plurality of individual measuring arrangements around the individual active conductors, the sum being ascertained computationally. The sum current measuring arrangement 352 delivers a voltage induced by the currents through the lines 51C, 52C and that is converted, in a sum current evaluation device 35, into a signal characterizing the sum current and thus the (sum of the) leakage currents, which signal is supplied to the compensation device 39 via a line 351. The compensation current may be fed in at the coupling-in point 37 in the form of a closed-loop control operation (taking into consideration the fed-in compensation current) or in the form of an open-loop control operation (not taken into consideration). This depends on whether the leakage currents are measured upstream or downstream of the infeed.

The US split-phase supply grid is a single-phase three-conductor grid. The voltage source 11 usually provides an AC voltage with an amplitude of 120 volts at the connection HOT1 and the AC voltage source 12 provides a phase HOT2 that is phase-shifted by 180 degrees with respect to the phase HOT1 at the connection HOT2. The AC filter device 31 serves to reduce interference and thus to improve EMC. The phases HOT1 and HOT2 are supplied to the AC-to-DC converter 32 via the lines MC and 52C, and said AC-to-DC converter performs a rectification. The DC side of the AC-to-DC converter 32 is also referred to as DC link circuit or DC voltage link circuit, or generally as link circuit. Interfering voltages or interfering signals are again reduced via the DC filter device 33, and the DC voltage is then supplied to the device 34 via the lines 61B and 62B.

The AC filter device 31 and the DC filter device 33 act in both directions.

The AC-to-DC converter 32 may also be of bidirectional design, and it therefore also allows energy to be transferred from the device 34 to the AC side of the AC-to-DC converter 32.

In the ideal case, currents flow only between the phase connections HOT1 and HOT2, that is to say in the active conductors. Leakage currents however almost always occur in practice. Leakage currents are currents that flow from the phases HOT1 and/or HOT2 to the protective earth connection PE. Such leakage currents occur for example due to capacitors that are provided in the AC filter device 31 and/or the DC filter device 33 as filter capacitors and are connected in between one of the active conductors and the protective earth connection 99. The leakage currents are detected for example in a fault current circuit breaker of the supply grid 10 and may lead to tripping of the fault current circuit breaker. The compensation device 39 is therefore provided in order to compensate for the leakage currents. This is achieved for example by measuring the leakage currents and by generating a corresponding signal that makes it possible to generate a compensation current I_C.

Figure 2:
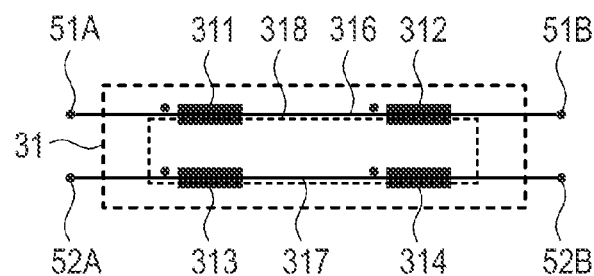
FIG. 2 shows an AC filter device of the arrangement of FIG. 1.

FIG. 2 shows a schematic illustration of one exemplary embodiment of the AC filter device 31 of FIG. 1. The AC filter device 31 is connected to the lines MA and 52A, on the one hand, and to the lines 51B and 52B, on the other hand. Two inductors 311, 312, connected in series via a line 316, are provided between the lines 51A and 51B. Two inductors 313, 314, connected in series via a line 317, are provided between the lines 52A and 52B. Provision is preferably made for a coil core 318 on which the inductors 311, 312, 313 and 314, designed as coils, are provided. The coils may also be referred to as chokes. The coil core 318 is for example a ferrite core, and it may have an annular profile. Annular in this case means that the coil core 318 has an inner opening, and the coil core 318 does not have to be of circular design. It may for example also be of rectangular design.

If a multiphase supply grid 10 is used, it is necessary to provide further paths containing inductors for the additional active conductors.

The exemplary embodiment is illustrated in simplified form, and the X-capacitors and Y-capacitors normally provided for filtering purposes are not illustrated.

Figure 3:
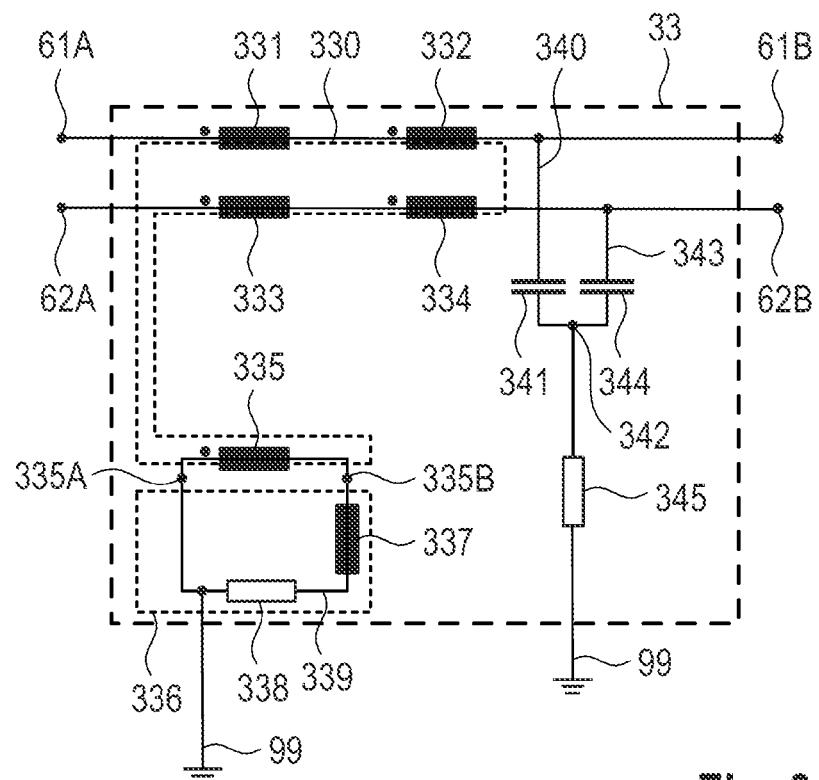
FIG. 3 shows a DC filter device of the arrangement of FIG. 1.

FIG. 3 shows an exemplary embodiment of the DC filter device 33. The line 61A is connected to the line 61B via two series-connected coils (inductors) 331, 332. The line 62A is connected to the line 62B via two series-connected coils (inductors) 333, 334. The line 61B is connected to a capacitor 341 via a line 340, and the line 62B is connected to a capacitor 344 via a line 343. The capacitors 341, 344 are connected to a point 342, and the point 342 is connected to the protective earth connection 99 via a resistor 345. The capacitors 341, 344 act as Y-capacitors for suppressing common-mode interference.

The components of the DC filter device 33 that have been described up until now form one possible embodiment of such a DC filter device for improving EMC.

The DC filter device 33 additionally has a coil 335 having a first coil connection 335A and a second coil connection 335B. The first coil connection 335A and the second coil connection 335B are connected to one another via a circuit device 336. The circuit device 336 has a resistor 338 that leads to damping of the current through the circuit device 336. The circuit device 336 additionally preferably has a coil 337 that is connected in series with the resistor 338.

Provision is preferably made for a coil core 330 on which the coils 331, 332, 333, 334 and 335 are arranged. The coil core 330 may for example be annular (for example with a round or angular basic shape) or rod-shaped. The common coil core 330 allows an advantageous interaction between the coils and good common-mode coupling of the coil 335.

The coil 335 with the circuit device 336 leads to influencing of the transfer function of the DC filter device 33.

The circuit device 336 is preferably connected to the protective earth connection 99. This connection leads to a change in the capacitive property of the circuit device 336. The connection to the protective earth connection 99 may also be dispensed with; it is thus optional and may be selected depending on which version enables the better damping.

Component values are given below by way of example:
Resistor 338: 100 ohms or 120 ohms or 39 ohms
Coils 331, 332, 333, 334, 335: 200 µH at 10 kHz or 220 µH at 10 kHz Coil 337: 1.0 mH at 1 kHz or 0.8 mH at 1 kHz or 6.4 mH at 10 kHz.
Capacitors 341, 344: 680 nF or 750 nF A nanocrystalline material has proven to be advantageous for the coil core 330. Coils having such a coil core 330 have well-suited inductances, in particular at high frequencies of for example 100 kHz in the present application case. The coil core 330 may comprise a ferrite material in an alternative embodiment.

Figure 4:
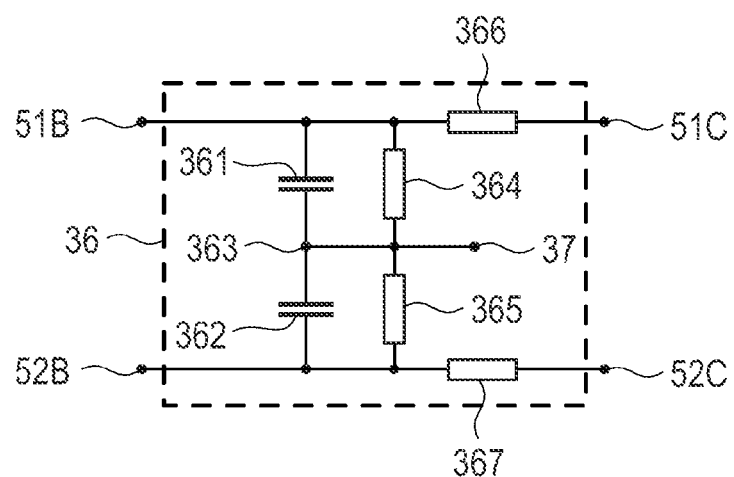
FIG. 4 shows a potential generation device of the arrangement of FIG. 1.

FIG. 4 shows a potential generation device 36 for providing the coupling-in point 37. The line 51B is connected to the line 52B via a capacitor 361, a point 363 and a capacitor 362. The point 363 is connected to the line 51B via a resistor 364 and to the line 52B via a resistor 365. The line 51B is connected to the line 51C via a resistor 366. The line 52B is connected to the line 52C via a resistor 367. The point 363 is connected to the coupling-in point 37.

Since the phases HOT1 and HOT2 on the lines 51B and 52B are in phase opposition, this results in a low potential at the coupling-in point 37 through the capacitor divider 361, 362 and through the resistor divider 364, 365. The potential at the coupling-in point 37 should in theory be zero volts, but it usually deviates at least slightly therefrom in practice. It is however considerably lower than the potential on the lines 51B and 52B. This is advantageous since it is thereby made easier to impress a current between the protective earth connection 99 and the coupling-in point 37.

In one preferred exemplary embodiment, the resistors 364, 365 are designed as controllable resistors, for example in the form of MOSFETs or other electronic switches. This makes it possible to actively influence the potential at the point 37. When the potential at the point 37 is as low as possible, infeeding is possible in a comparatively simple manner.

Figure 5:
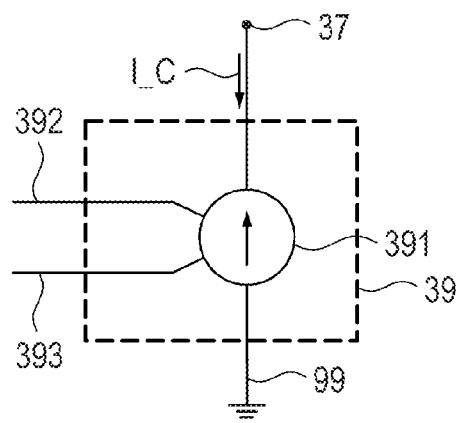
FIG. 5 shows a compensation device of FIG. 1.

FIG. 5 shows an exemplary embodiment of the compensation device 39, said compensation device having an end stage 391 that is connected in between the coupling-in point 37 and the protective earth connection 99. The end stage 391 is supplied with a voltage via a line 392 and a line 393 and, on the basis of this voltage, the compensation device 39 generates a compensation current I_C that flows, depending on its mathematical sign, to the protective earth connection 99 or to the coupling point 37. The end stage 391 is formed for example by way of an operational amplifier.

The voltage between the lines 392 and 393 may, due to the potential generation device 36 of FIG. 4, be lower than in the case of a direct infeed into the line 51B and/or 52B. It may however, as an alternative or in addition, be fed directly into the lines 51B and/or 52B when the end stage 391 is supplied with a correspondingly high voltage via the lines 392, 393.

The value of the voltage on the lines 392, 393 defines the value of the compensation current I_C, and the voltage on the lines 392, 393 is therefore preferably defined on the basis of the measured leakage currents.

The compensation current I_C preferably has a phase shift of 180° with respect to the measured leakage current. This phase shift may be generated in the compensation device 39 or as early as in the . . . 35 (cf. FIG. 1).

Figure 6:
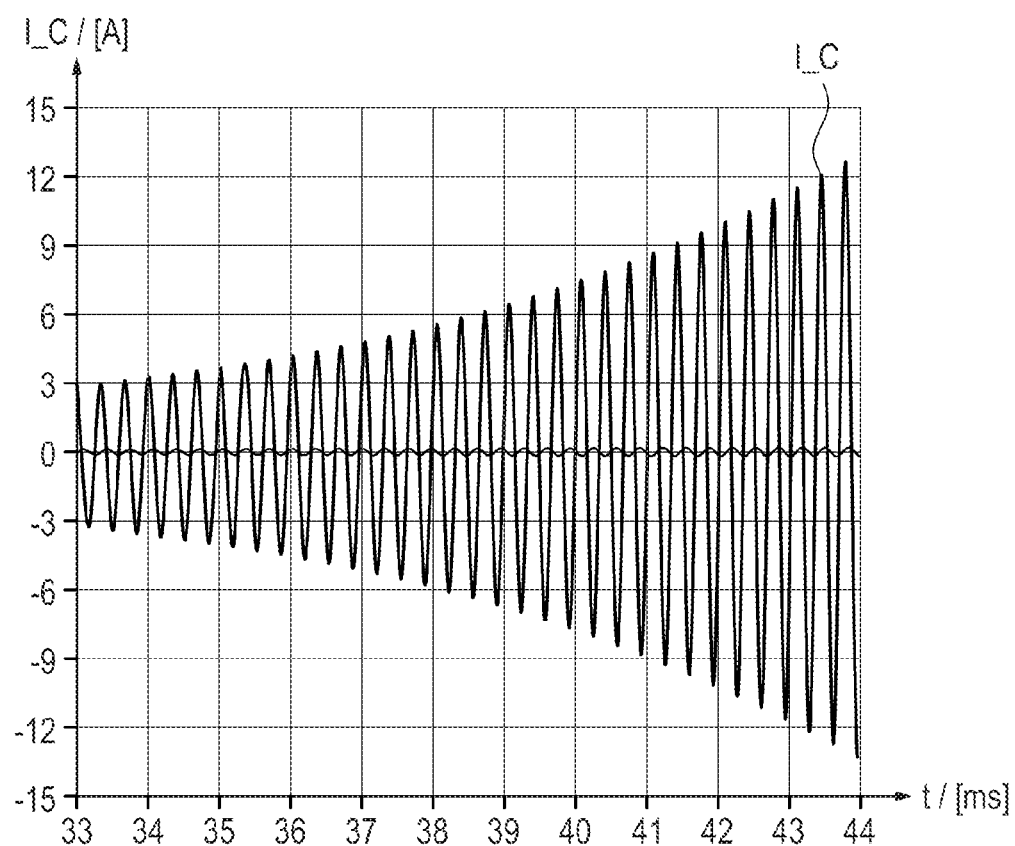
FIG. 6 shows a compensation current with undesired oscillations.

FIG. 6 shows, in a simulation, a graph in which the compensation current I_C is plotted against time t. The simulation was performed using a DC filter device according to FIG. 3, but without the coil 335 and the circuit device 336.

It may be seen that the compensation current I_C oscillates, and the amplitude increases from initially 3 A to around 12 A over a period of 11 ms.

It was observed in trials that the compensation device 39, which usually regulates the compensation current I_C to a target value using a current regulator, generates a compensation current I_C containing undesired oscillations in the case of coupling-in at the coupling-in point 37. Since the undesired oscillations, in the case of coupling-in between the AC filter device 31 and the AC-to-DC converter 32, may lead to tripping of a fault current circuit breaker, the system was investigated in more detail both in trials and in simulations.

Such oscillations did not occur in the case of coupling-in in the region between the supply grid 10 and the AC filter device 31. Coupling-in between the supply grid 10 and the AC filter device 31 however has other disadvantages. First of all, circuit parts upstream of the AC filter device 31 may lead to considerable worsening of EMC, and second of all what are known as grid transients upstream of the AC filter device 31 may lead to overvoltages that complicate the compensation of the leakage currents and may also lead to destruction of the compensation circuit.

Figure 7:
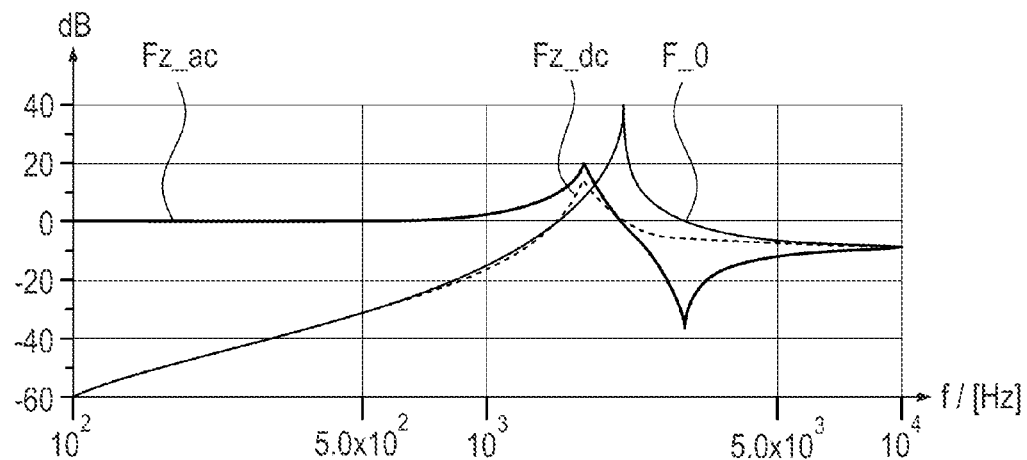
FIG. 7 shows the amplitude response of a first exemplary embodiment of a plurality of transfer functions.

FIG. 7 shows the amplitude response in decibels (dB, logarithmic scale), plotted on a logarithmic depiction of the frequency f. The amplitude response of the transfer function Fz_ac for the AC component, the transfer function Fz_dc for the DC component and the transfer function F_0 are illustrated. Transfer functions generally show the damping and the phase angle, plotted against frequency, and they allow a person skilled in the art to assess the circuit, in the present case to assess the action of the compensation device 39. The resistance R was chosen to be very small with a value of R=0.1 ohms in this simulation.

For the graph, the following values were assumed in a simulation:

L_ac=2 mH
L_dc=2 mH
C=1.4 µF
R=0.1 ohms

It may be seen that the transfer function F_0 is sometimes greater than 0, and this leads to a gain in this region and thus possibly to oscillation.

Figure 8:
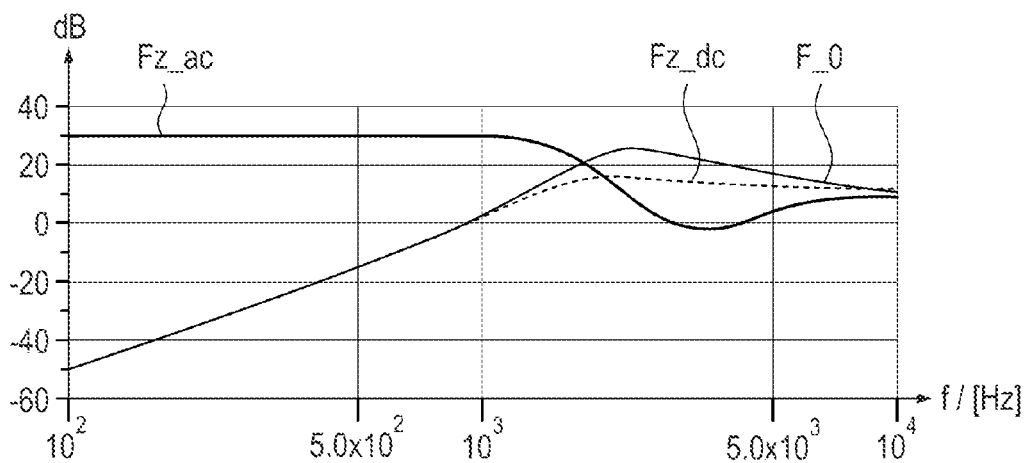
FIG. 8 shows the amplitude response of a second exemplary embodiment of a plurality of transfer functions.

FIG. 8 shows the corresponding amplitude response in an arrangement in which, in contrast to FIG. 7, the resistance R was set to 20 ohms. With this value of the resistor 14 of FIG. 1, the transfer function F_0 in the whole frequency range is less than 0, and there is no corresponding undesired oscillation.

Figure 9:
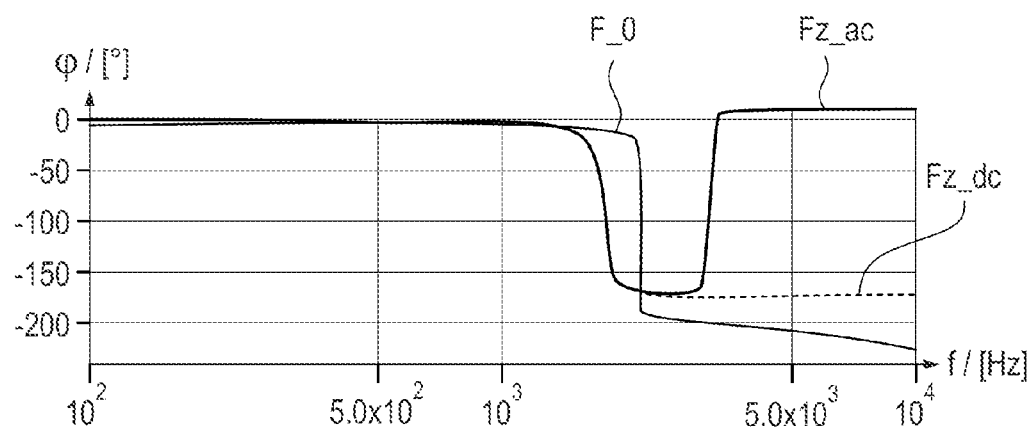
FIG. 9 shows the phase response of the first exemplary embodiment of FIG. 7.

FIG. 9 shows the phase response in a linear depiction, plotted against a logarithmic depiction of the frequency for the transfer functions Fz_ac, Fz_dc and F_0 with the corresponding parameters of FIG. 7. The phase of the transfer function F_0, at the small resistance R=0.1 ohms, has a steep gradient and drops from around 0 degrees to around minus 180 degrees. The point at which the transfer function F_0 reaches the value of minus 180 degrees is approximately the point of maximum amplitude in FIG. 7.

Figure 10:
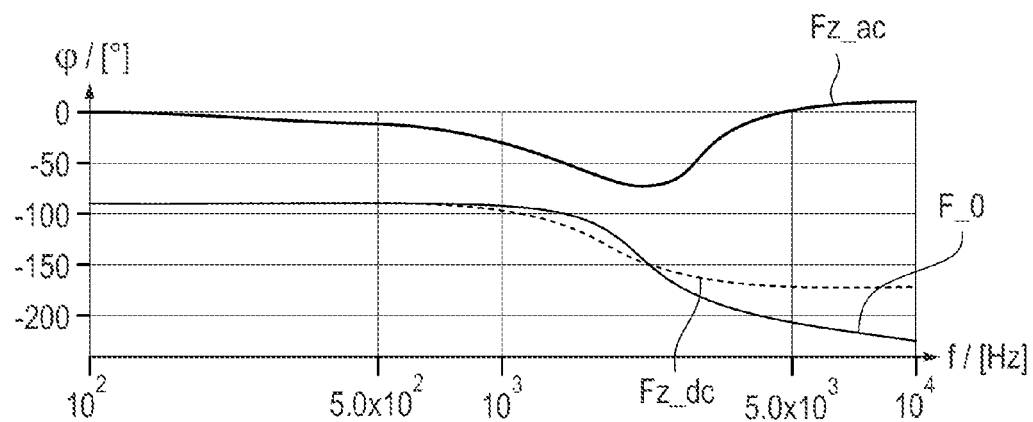
FIG. 10 shows the phase response of the second exemplary embodiment of FIG. 8.

FIG. 10 is a graph containing the phase response plotted against frequency according to FIG. 9. The parameters of FIG. 8 were selected as parameters, with the resistance R=20 ohms. The larger resistance R has a significant effect on the transfer function.

FIG. 7 and FIG. 9 together form a Bode plot for R=0.1 ohms, and FIG. 8 and FIG. 10 together form a Bode plot for R=20 ohms.

The trial leads to the result that an excessively small protective earth resistance R or 14 in FIG. 1 may lead to oscillatory interference in the compensation of leakage currents.

Increasing the resistance 14 by adding a resistor to the arrangement 20 prevents the undesired oscillations. Increasing the protective earth resistance R by adding an additional resistor is however negative or possibly even forbidden, since a low-resistance connection between the protective earth connection 99 and the point 13 (cf. FIG. 1) must be present in order to allow good potential compensation and thus a good protective function. An additional resistor for example reduces the protective effect in the case of a protection class 1 electrical arrangement through potential compensation, since the flow of current between the protective earth and for example a metal housing is reduced by the additional resistor.

As an alternative solution for achieving the required damping of the transfer function F0, reference is made to the circuit of FIG. 3 with the coil 335 and the circuit device 336.

The basic thinking behind the coil 335 and the circuit device 336 is that of coupling in a damping resistor so as to damp common-mode currents in the DC filter device 33. The common-mode currents are low in comparison with the currents through the lines 61A and 62A, and small wire diameters are therefore possible for the coil 335 and in the circuit device 336. The components of the circuit device 336 may preferably be designed as SMD components so as to save space. Providing the coil 335 and circuit device 336 makes it possible to dispense with increasing the resistance R, and it is still possible to prevent or at least reduce the occurrence of undesired oscillations caused by a low resistance R.

A trial revealed that a design of the circuit device 336 without the coil 337 results in a high impedance at a frequency of 100 kHz. Providing the coil 337 leads to a lower impedance. In the calculated exemplary embodiment, the impedance was 28% higher without the coil 337 than with the coil 337.

Both the resistor 388 and the coil 337 are preferably designed as SMD components.

Numerous variations and modifications are of course possible within the scope of the present invention.

The mentioned component values are preferred values that may however be chosen differently depending on the application.

The arrangement 20 in the exemplary embodiment is connected to a US split-phase supply grid 10. As an alternative, other grids are also possible, such as a European grid with the active conductors L1, N or L1-L3, N and the protective earth PE.

The AC filter device 31 and the DC filter device 33 may have further filter capacitors, in particular X-capacitors and Y-capacitors.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. An arrangement, the arrangement comprising:
   an AC filter device;

an AC-to-DC converter; and
a DC filter device, the DC filter device comprising:
- a first filter device connection;
- a second filter device connection;
- a third filter device connection;
- a fourth filter device connection;
- a coil core;
- at least one first coil arranged on the coil core, the at least one first coil being connected in between the first filter device connection and the third filter device connection;
- at least one second coil arranged on the coil core, the at least one second coil being connected in between the second filter device connection and the fourth filter device connection; and
- a third coil arranged on the coil core, the third coil having a first coil connection and a second coil connection, wherein the first coil connection and the second coil connection are connected to one another via a circuit device comprising a resistor,
wherein the AC filter device is provided on an AC side of the AC-to-DC converter and,
wherein the DC filter device is arranged on a DC side of the AC-to-DC converter,
wherein the arrangement further comprises a compensation device configured to compensate for leakage currents and to generate a compensation current between a protective earth connection and a predefined coupling-in point of the arrangement.

2. The arrangement of claim 1, wherein the resistor comprises an SMD component.

3. The arrangement of claim 1, wherein the circuit device has a fourth coil that is connected in series with the resistor.

4. The arrangement of claim 3, wherein the fourth coil comprises an SMD component.

5. The arrangement of claim 1, wherein the third filter device connection and the fourth filter device connection are each connected to a protective earth connection via an associated capacitor.

6. The arrangement of claim 1, wherein at least two first coils are arranged on the coil core and connected in between the first filter device connection and the third filter device connection, and
wherein at least two second coils are arranged on the coil core and connected in between the second filter device connection and the fourth filter device connection.

7. The arrangement of claim 1, wherein the predefined coupling-in point is provided between the AC filter device and the DC filter device.

8. The arrangement of claim 1, wherein the predefined coupling-in point is provided between the AC filter device and the AC-to-DC converter.

9. The arrangement of claim 1, wherein the compensation device has a current regulator configured to regulate the compensation current to a target value.

10. An on-board power system for a vehicle, the on-board power system comprising:
the arrangement of claim 1, wherein the AC filter device is configured to connect to an AC voltage supply external to the vehicle.

* * * * *